United States Patent
Oh et al.

(10) Patent No.: US 10,529,787 B2
(45) Date of Patent: Jan. 7, 2020

(54) BACKPLANE SUBSTRATE, MANUFACTURING METHOD FOR THE SAME, AND ORGANIC LIGHT-EMITTING DISPLAY DEVICE USING THE SAME

(71) Applicant: LG Display Co., Ltd., Seoul (KR)

(72) Inventors: Kum-Mi Oh, Seoul (KR); Shun-Young Yang, Bucheon-si (KR); Min-Seong Yun, Namyangju-si (KR)

(73) Assignee: LG Display Co., Ltd., Seoul (KR)

( * ) Notice: Subject to any disclaimer, the term of this patent is extended or adjusted under 35 U.S.C. 154(b) by 26 days.

(21) Appl. No.: 15/639,743

(22) Filed: Jun. 30, 2017

(65) Prior Publication Data
US 2018/0006102 A1 Jan. 4, 2018

(30) Foreign Application Priority Data
Jun. 30, 2016 (KR) .......................... 10-2016-0082946

(51) Int. Cl.
| | |
|---|---|
| H01L 27/32 | (2006.01) |
| H01L 29/786 | (2006.01) |
| H01L 29/423 | (2006.01) |
| H01L 27/12 | (2006.01) |
| G09G 3/3225 | (2016.01) |

(52) U.S. Cl.
CPC ....... H01L 27/3262 (2013.01); *G09G 3/3225* (2013.01); *G09G 2320/0242* (2013.01); *G09G 2340/0407* (2013.01); *G09G 2340/145* (2013.01); *H01L 27/1222* (2013.01); *H01L 27/1251* (2013.01); *H01L 27/1255* (2013.01); *H01L 27/1274* (2013.01); *H01L 27/3265* (2013.01); *H01L 29/42384* (2013.01); *H01L 29/78621* (2013.01); *H01L 29/78672* (2013.01)

(58) Field of Classification Search
None
See application file for complete search history.

(56) References Cited

U.S. PATENT DOCUMENTS

2005/0116291 A1* 6/2005 Koo ................... H01L 27/1214
257/347
2005/0242745 A1 11/2005 Jung
(Continued)

FOREIGN PATENT DOCUMENTS

| JP | 2001-320056 A | 11/2001 |
|---|---|---|
| JP | 2010-003668 A | 1/2010 |

(Continued)

OTHER PUBLICATIONS

Japanese Office Action dated Jun. 26, 2018 issued in a corresponding application No. JP 2017-129356.

*Primary Examiner* — Walter H Swanson
*Assistant Examiner* — Kien C Ly
(74) *Attorney, Agent, or Firm* — Polsinelli PC

(57) ABSTRACT

Disclosed are a backplane substrate, which is devised to attain circuit characteristics for realizing sufficient gradation even in smaller pixels of a super-high-resolution structure, a manufacturing method for the same, and an organic light-emitting display device using the same, inn the backplane substrate, a driving thin-film transistor has a stack structure different from that of other thin-film transistors so that only the S-factor of the driving thin-film transistor is increased.

15 Claims, 7 Drawing Sheets

(56) References Cited

U.S. PATENT DOCUMENTS

| | | | | |
|---|---|---|---|---|
| 2010/0271349 A1* | 10/2010 | Liu | ............... | G09G 3/3225 |
| | | | | 345/205 |
| 2015/0014641 A1* | 1/2015 | Jung | ............... | H01L 27/3262 |
| | | | | 257/40 |
| 2015/0228799 A1* | 8/2015 | Koezuka | ............... | H01L 27/124 |
| | | | | 257/43 |
| 2015/0228803 A1* | 8/2015 | Koezuka | ............... | H01L 29/78693 |
| | | | | 257/43 |
| 2017/0352551 A1* | 12/2017 | Yamazaki | ............... | H01L 21/465 |

FOREIGN PATENT DOCUMENTS

| | | | |
|---|---|---|---|
| JP | 2015-194577 A | | 11/2015 |
| WO | 2009/019920 A1 | | 2/2009 |
| WO | 2016/013264 A1 | | 1/2016 |

* cited by examiner

BACKPLANE SUBSTRATE, MANUFACTURING METHOD FOR THE SAME, AND ORGANIC LIGHT-EMITTING DISPLAY DEVICE USING THE SAME

CROSS REFERENCE TO RELATED APPLICATION

This application claims the benefit of Korean Patent Application No. 10-2016-0082946, filed on Jun. 30, 2016, which is hereby incorporated by reference in its entirety as if fully set forth herein.

BACKGROUND

Field of the Disclosure

The present disclosure relates to a display device, and more particularly, to a backplane substrate of an organic light emitting display device and a method of manufacturing the same, which enables a high gradation even in smaller pixels of a super-high-resolution structure.

Description of the Background

With development of various portable electronic appliances such as mobile communication terminals and laptop computers, there is an increasing demand for flat-panel display devices that may be applied thereto.

As such flat-panel display devices, for example, liquid crystal display devices, plasma display panel devices, field emission display devices, and organic or inorganic light-emitting display devices have been studied. Among these flat-panel display devices, in particular, the application of an organic light-emitting display device is increasing owing to several advantages thereof, such as development of mass-production technology, ease of driving means, a low power consumption, a high image quality, ease of realization of a large screen, and flexibility and etc.

In addition, such a flat-panel display device includes a plurality of pixels in a matrix form and also includes one or more thin-film transistors (TFTs) in each pixel to individually control the respective pixels. Each pixel may include an R-sub-pixel, a G-sub-pixel and a B-sub-pixel for color expression.

However, since a display device for augmented reality or virtual reality needs to realize a high resolution within a limited size, the size of individual pixels is gradually being reduced. In addition, in a display device in which a light-emitting element is provided in an individual sub-pixel, such as an organic light-emitting display device, circuit elements, such as at least two thin-film transistors and one capacitor (2T1C structure), need to be provided in the individual sub-pixel in order to allow the individual sub-pixel to be selectively driven for gradation, and in this case, the respective thin-film transistors have the same structure. However, although element characteristics such as, for example, mobility of the respective thin-film transistors, are improved when the area of the individual sub-pixel is small, a driving thin-film transistor may undergo the saturation of current within a short time when a gate voltage is applied thereto, which makes it difficult to realize various and sufficient gradation.

That is, the higher the resolution, the smaller the sub-pixel, and all circuit elements required to drive each sub-pixel need to be included in the limited area of the sub-pixel. In this case, when the driving thin-film transistor has the same stack structure as the other thin-film transistors, the response time of the thin-film transistors is fast, but sufficient gradation is difficult.

SUMMARY OF THE DISCLOSURE

Accordingly, the present disclosure is directed to a backplane substrate, a manufacturing method for the same, and an organic light-emitting display device using the same that substantially obviate one or more problems due to limitations and disadvantages of the related art.

The present disclosure is to provide a backplane substrate, which enables high gradation even in smaller pixels of a super-high-resolution structure, and an organic light-emitting display device using the same.

In a backplane substrate of the present disclosure, a driving thin-film transistor and a switching thin-film transistor may have different structures, so that the driving thin-film transistor secures a sufficient S-factor so as to enable high gradation and the switching thin-film transistor and other thin-film transistors maintains circuit characteristics, such as high mobility, whereby both high gradation and a predetermined level of element characteristics may be achieved.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a backplane substrate includes a substrate having a plurality of sub-pixels, a driving thin-film transistor located in each sub-pixel and including a first gate electrode, a first active layer formed of polysilicon, a first source electrode and a first drain electrode connected to opposite sides of a first channel of the first active layer, and a first gate insulating layer between the first active layer and the first gate electrode, and a switching thin-film transistor located in each sub-pixel so as to be connected to the driving thin-film transistor and including a second gate electrode, a second active layer formed of polysilicon, a second source electrode and a second drain electrode connected to opposite sides of a second channel of the second active layer, and a second gate insulating layer between the second active layer and the second gate electrode, wherein the first active layer and the second active layer are located in the same layer, wherein the first gate electrode and the second gate electrode are located in different layers, and wherein a first distance between the first gate electrode and the first active layer is longer than a second distance between the second gate electrode and the second active layer.

The first gate insulating layer may be thicker than the second gate insulating layer.

In an example for this configuration, the first gate electrode and the first gate insulating layer may be located below the first active layer and the second active layer, and the second gate electrode and the second gate insulating layer may be located above the first active layer and the second active layer.

In this case, the first gate electrode may be thinner than the second gate electrode, and may have a thickness within a range from 500 Å to 2000 Å.

The backplane substrate may further include a buffer thin-film transistor including a third gate electrode, a third source electrode and a third drain electrode, which are located respectively in the same layers as the second gate electrode, the second source electrode and the second drain electrode of the switching thin-film transistor.

The first gate electrode may be connected to the second source electrode.

The first source electrode may be connected to the third source electrode.

In another example, the second gate electrode and the second gate insulating layer may be located below the first active layer and the second active layer, and the first gate electrode and the first gate insulating layer may be located above the first active layer and the second active layer. In this case, the second gate electrode may be thinner than the first gate electrode, and the second gate electrode may have a thickness within a range from 500 Å to 2000 Å.

The substrate may be divided into an active area having the sub-pixels and a peripheral area, and the backplane substrate may further include a circuit thin-film transistor having the same structure as the switching thin-film transistor in the peripheral area.

The first source electrode may be connected to an anode electrode of an organic light-emitting diode.

In accordance with another aspect of the present disclosure, an organic light-emitting display device includes a substrate having a plurality of sub-pixels, a driving thin-film transistor located in each sub-pixel and including a first gate electrode, a first active layer formed of polysilicon and located above the first gate electrode, a first source electrode and a first drain electrode connected to opposite sides of a first channel of the first active layer, and a first gate insulating layer between the first active layer and the first gate electrode, a switching thin-film transistor located in each sub-pixel so as to be connected to the driving thin-film transistor and including a second gate electrode, a second active layer formed of polysilicon and located below the second gate electrode, a second source electrode and a second drain electrode connected to opposite sides of a second channel of the second active layer, and a second gate insulating layer between the second active layer and the second gate electrode, a storage capacitor between the first gate electrode and the first source electrode, and an organic light-emitting diode including an anode connected to the first source electrode, a cathode opposite the anode, and an organic layer including an organic light-emitting layer located between the anode and the cathode, wherein the first active layer and the second active layer are located in the same layer, and the first gate insulating layer is thicker than the second gate insulating layer.

In accordance with a further aspect of the present disclosure, a method of manufacturing a backplane substrate includes preparing a substrate having a plurality of sub-pixels, each sub-pixel having a first area and a second area partitioned from each other, providing a first gate electrode in the first area of the sub-pixel, providing a first gate insulating layer having a first thickness so as to cover the first gate electrode, providing a first active layer and a second active layer on the first gate insulating layer in the first area and the second area respectively, the first active layer and the second active layer being formed of polysilicon, providing a second gate insulating layer having a second thickness, which is smaller than the first thickness, so as to cover the first and second active layers, providing a second gate electrode on the second gate insulating layer so as to correspond to a top of the second active layer, and providing a first source electrode and a first drain electrode connected to opposite sides of the first active layer and a second source electrode and a second drain electrode connected to opposite sides of the second active layer.

The providing the first active layer and the second active layer includes a first operation of depositing an amorphous silicon layer on an entire surface of the first gate insulating layer, a second operation of crystallizing the amorphous silicon layer to a polysilicon layer, and a third operation of selectively removing the polysilicon layer so as to leave the first active layer and the second active layer in the first area and the second area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
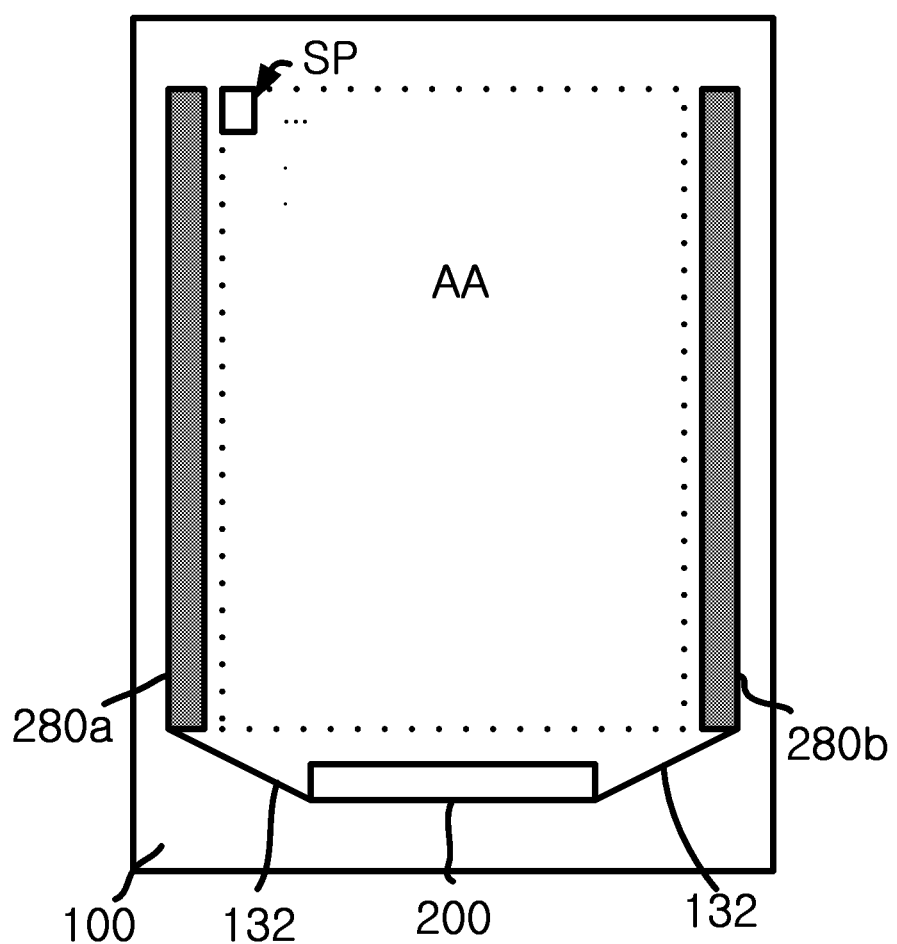
FIG. 1 is a plan view illustrating an organic light-emitting display device according to the present disclosure.

Hereinafter, the aspects of the present disclosure will be described in detail with reference to the accompanying drawings. In the entire specification, the same reference numerals denote substantially the same constituent elements. In the following description, a detailed description of known functions and configurations incorporated herein will be omitted when it may make the subject matter of the present disclosure rather unclear. Also, the names of constituent elements used in the following description are selected taking into consideration ease of description of the specification, and may differ from the names of parts of actual products.

Meanwhile, among the terms to be described below, a backplane substrate means a substrate in which thin-film transistors are formed in each sub-pixel. The backplane substrate may be used in various types of display devices, and may function to selectively drive each sub-pixel. In the present disclosure, although an organic light-emitting display device is described as one example of a display device, the backplane substrate of the present disclosure is not limited to the organic light-emitting display device and may be applied to various display devices that require two or more thin-film transistors in each sub-pixel. The organic light-emitting display device is configured by connecting a driving thin-film transistor of each sub-pixel and an organic light-emitting diode (OLED) to each other.

Figure 2:
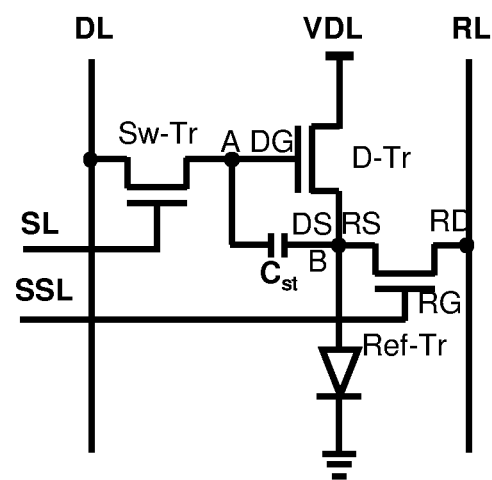
FIG. 2 is a circuit diagram of one sub-pixel in the organic light-emitting display device according to the present disclosure.

FIG. 1 is a plan view illustrating an organic light-emitting display device according to the present disclosure, and FIG. 2 is a circuit diagram of one sub-pixel in the organic light-emitting display device according to the present disclosure.

The organic light-emitting display device of the present disclosure, as illustrated in FIG. 1, includes an active area AA in the center of a substrate 100, a plurality of sub-pixels SP provided in a matrix form in the active area AA, and gate drivers 280a and 280b and a driver integrated circuit (IC) 200 around the active area AA. In addition, an inner connection wiring 132 is provided between the driver IC 200 and the gate drivers 280a and 280b so as to connect them to each other.

Each sub-pixel SP in the active area AA, as illustrated in FIG. 2, includes a wiring including a scan line SL and a sensing line SSL, which are parallel to each other in the horizontal direction, and a first voltage line VDL, a data line DL and a second voltage line RL, which intersect the scan line SL and the sensing line SSL and are parallel to one another. The sub-pixel SP further includes a switching thin-film transistor Sw-Tr provided at the intersection of the scan line SL and the data line DL, a driving thin-film transistor D-Tr provided between the switching thin-film transistor Sw-Tr and the first voltage line VDL, and a sensing thin-film transistor Ref-Tr provided at the intersection of the sensing line SSL and the second voltage line RL.

Here, a connection node of the switching thin-film transistor Sw-Tr and the driving thin-film transistor D-Tr is referred to as a first node A, and a connection node of the driving thin-film transistor D-Tr and the sensing thin-film transistor Ref-Tr is referred to as a second node B.

A storage capacitor $C_{st}$ is provided between the first and second nodes A and B to achieve the holding characteristics of each sub-pixel, and one side electrode, i.e. the side of the second node B of the storage capacitor $C_{st}$ is connected to an organic light-emitting diode (OLED). An anode electrode of the organic light-emitting diode (OLED) is connected to the second node B, a cathode electrode is connected to a ground terminal, and an organic layer including an organic light-emitting layer is provided between the anode electrode and the cathode electrode. Here, the organic layer may include a single organic light-emitting layer, or may include a hole injection layer and/or a hole transport layer provided between the anode electrode and the organic light-emitting layer and an electron transport layer and/or an electron injection layer provided between the cathode electrode and the organic light-emitting layer.

In the switching thin-film transistor Sw-Tr, a switching gate electrode SG forms a portion of the scan line SL or a pattern protruding therefrom, a switching drain electrode SD is connected to the data line DL, and a switching source electrode SS is connected to the first node A. The first node A is also connected to a gate electrode DG of the driving thin-film transistor D-Tr.

In the driving thin-film transistor D-Tr, the driving gate electrode DG is connected to the first node A, a driving drain electrode DD is connected to the first voltage line VDL, and a driving source electrode DS is connected to the second node B. In some cases, a separate electrode may be formed on a back-channel portion of the driving thin-film transistor D-Tr.

In the sensing thin-film transistor Ref-Tr, a sensing gate electrode RG forms a portion of the sensing line SSL or a pattern protruding therefrom, a sensing drain electrode RD is connected to the second voltage line RL, and a sensing source electrode RS is connected to the second node B.

Here, in some cases, the sensing line SSL, the second voltage line RL, and the sensing thin-film transistor Ref-Tr may be omitted from the sub-pixel.

The switching thin-film transistor Sw-Tr is connected to the scan line SL and the data line DL and functions to select the corresponding sub-pixel. In addition, the driving thin-film transistor D-Tr functions to drive the organic light-emitting diode (OLED) of the sub-pixel selected by the switching thin-film transistor Sw-Tr. When the sensing thin-film transistor Ref-Tr is provided, it is connected between the sensing line SSL and the second voltage line RL and functions to sense or initialize a voltage value of the second node B. The following description is based on an example in which the sensing thin-film transistor Ref-Tr is provided in consideration of the advantages of initialization and sensing. In some cases, the sensing thin-film transistor may be omitted. In addition, a separate buffer transistor, which has the same stack structure as the switching thin-film transistor and the sensing thin-film transistor, may be further provided to compensate for deterioration.

In the illustrated circuit diagram, a driving voltage is supplied to the first voltage line VDL, and a reference voltage is supplied to the second voltage line RL. Alternatively, a voltage value of the second node B may be read via the second voltage line RL.

The multiple sub-pixels are provided in a matrix form on the substrate 100, and in each sub-pixel, a storage capacitor area may be defined in the intersection area of the scan line SL and the sensing line SSL, which are spaced apart from each other, and the first voltage line VDL and the data line DL, which are spaced apart from each other.

In addition, the scan line SL and the sensing line SSL receive a scan signal and a sensing signal via the gate drivers 280a and 280b of FIG. 1. The gate drivers 280a and 280b may be mounted in the substrate 100, rather than having the form of a separate integrated circuit (IC) or tape carrier package (TCP), or the form of a chip on glass (COG). In this case, a plurality of circuit thin-film transistors may be provided for each scan line/sensing line. The circuit thin-film transistors have the same (stack) structure as the switching thin-film transistor, which will be described below, and consequently, have a high mobility and a stabilized threshold voltage.

Meanwhile, the driver IC 200 may include a source driver, a controller configured to control the timing of the gate drivers and the source driver, and a power supply.

In the backplane substrate and the organic light-emitting display device of the present disclosure, the circuit of each sub-pixel may have a 3T1C structure described above or a 2T1C structure, or any other structure in which thin-film transistor(s) or capacitor(s) can be added to the 2T1C or 3T1C structure.

In the backplane substrate and the organic light-emitting display device of the present disclosure, the thin-film transistors of each sub-pixel have different stack structures so that at least the driving thin-film transistor has an S-factor different from that of the other thin-film transistors.

Hereinafter, the reason why the driving thin-film transistor has an S-factor different from that of the other thin-film transistors according to the present disclosure will be described.

Figure 3A:
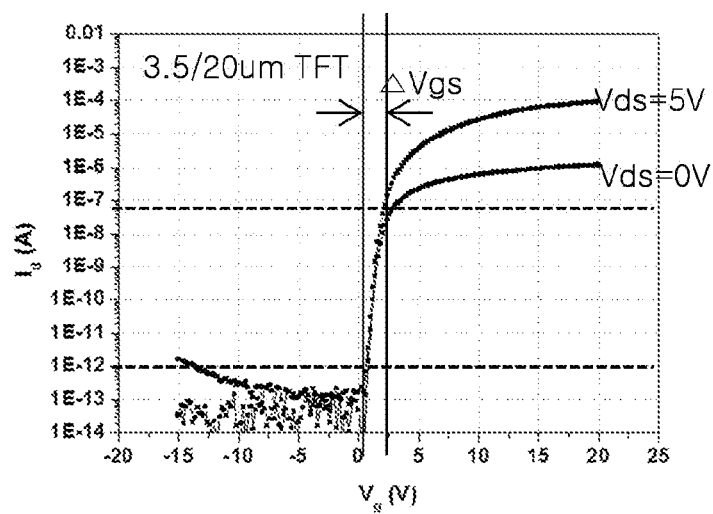
FIGS. 3A and 3B are graphs illustrating $V_g$-$I_d$ characteristics under different areas of the sub-pixel in a driving thin-film transistor and a switching thin-film transistor having the same stack structure.
Figure 3B:
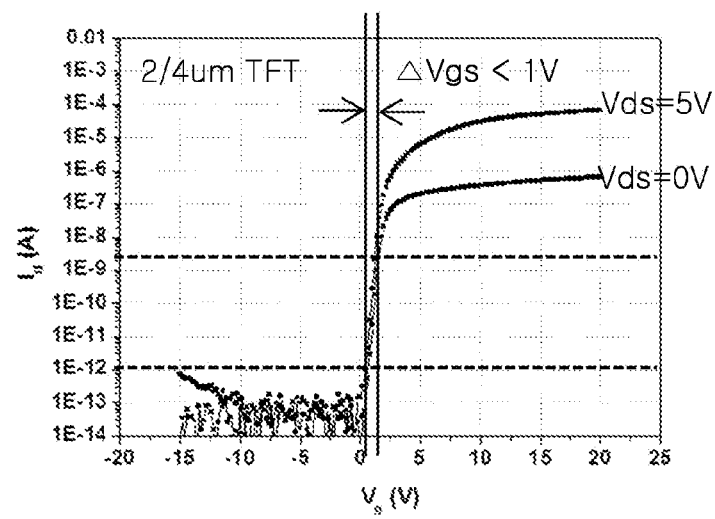

FIGS. 3A and 3B are graphs illustrating $V_g$-$I_d$ characteristics under different areas of the sub-pixel in the driving thin-film transistor and the switching thin-film transistor having the same stack structure.

FIG. 3A illustrates $V_g$-$I_d$ characteristics in a modern full-high-density (FHD) structure having a resolution of 403 ppi (pixels per inch), and FIG. 3B illustrates $V_g$-$I_d$ characteristics in a super-high-resolution structure having a resolution of 1500 ppi in which the area of each sub-pixel is reduced to about $1/14$ of that in the FHD structure. Here, the experiment was performed under the conditions that, in both the structures, all thin-film transistors have the same stack structure, for example, a top-gate-electrode structure.

Among modern display devices, for example, 3D glasses and mobile devices tend to require a smaller panel, the ability to display an image resembling an actual image, and a resolution of 1000 ppi or more. However, since these devices have a small size, the size of each sub-pixel is reduced as the resolution is increased.

For example, an individual sub-pixel in the FHD structure has a width of 31.5 μm and a length of 63 μm, whereas an individual sub-pixel in the 1500 ppi structure has a width of 8.45 μm and a length of 16.9 μm, and thus the area occupied by the circuit in the sub-pixel is reduced to about $1/14$ of that in the FHD structure.

As illustrated in FIG. 3B, when the area of the sub-pixel is reduced, the area of emission of light is reduced, and thus a required drain current (Id) value is within a small range (from $1 \times 10^{-12}$ A to $5 \times 10^{-9}$ A). In contrast, since the area of emission of light is large when the area of the sub-pixel is large, as illustrated in FIG. 3A, a required drain current (Id) value is within a large range (from $1 \times 10^{-12}$ A to $1 \times 10^{-7}$ A). Thus, when thin-film transistors having the same stack structure are provided in the sub-pixels of the FHD structure and the 1500 ppi structure, as illustrated in FIG. 3A, $\Delta V_{gs}$ is about 2V and the drain current Id in the saturated state is about $1 \times 10^{-7}$ A in the FHD structure, whereas, as illustrated in FIG. 3B, $\Delta V_{gs}$ is below about 1V and the drain current Id in the saturated state is about $5 \times 10^{-9}$ A in the 1500 ppi high-resolution structure. Accordingly, it can be observed that the drain current is saturated within a shorter time as the resolution is increased and thus the area of the sub-pixel is reduced, which makes it difficult to realize sufficient gradation. For reference, gradation is realized within a section from the time at which the thin-film transistors are turned on to the time at which the drain current is saturated, i.e. within $\Delta V_{gs}$. Accordingly, gradation is limited when the $\Delta V_{gs}$ is small.

That is, the above-described experiment shows that, under the assumption that all thin-film transistors have the same structure, variation in the area of the sub-pixel has an effect on the $\Delta V_{gs}$ from the time at which the thin-film transistors are turned on to the time at which the drain current is saturated. This means that it may be difficult to achieve sufficient gradation when the resolution is increased in the case where all thin-film transistors in the sub-pixel have the same stack structure.

Accordingly, in the backplane substrate and the organic light-emitting display device of the present disclosure, which aim a high-resolution small model, in order to realize sufficient gradation, the driving thin-film transistor, which has a direct effect on gradation, has a structure different from that of the other thin-film transistors, and in particular, there is a difference in S-factor between the driving thin-film transistor and the other thin-film transistors.

Figure 4A:
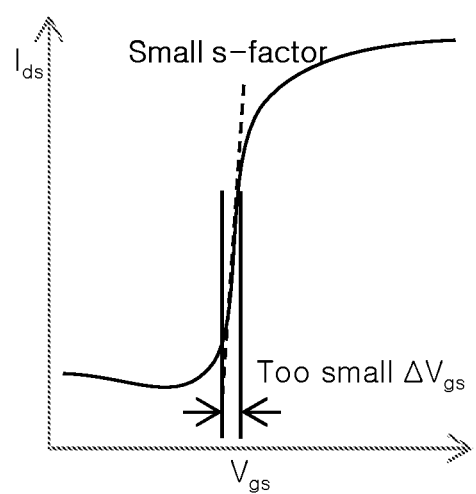
FIGS. 4A and 4B are graphs illustrating variation in S-factor depending on $\Delta V_{gs}$.
Figure 4B:
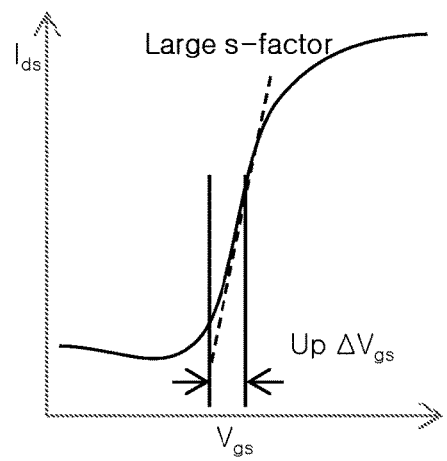

FIGS. 4A and 4B are graphs illustrating variation in S-factor depending on $\Delta V_{gs}$.

$$S = 2.3 \frac{kT}{q} \left[ 1 + \frac{(C_d + C_{it})}{C_i} \right] \quad \text{Equation 1}$$

In the organic light-emitting display device, the S-factor is the reciprocal of the gradient of drain current Ids from the time at which the thin-film transistors are turned on and the drain current is saturated, as illustrated in the graph illustrating the relationship of $V_{gs}$-$I_{ds}$, and is represented by Equation 1. Here, "$C_i$" is the capacity of a gate insulating layer, "$C_d$" is the capacity of an LDD area (depleted area), "$C_{it}$" is the density of the gate insulating layer captured in a gap, and kT/q is a thermal voltage of the organic light-emitting display device.

The S-factor is small when the $\Delta V_{gs}$ is small, as illustrated in FIG. 4A, whereas the S-factor is large when the $\Delta V_{gs}$ is large, as illustrated in FIG. 4B. The $\Delta V_{gs}$ and the S-factor are approximately proportional to each other.

In the above equation for calculating the S-factor, the factor that may be changed by a difference in structure between the thin-film transistors is "$C_i$". In particular, in the above Equation 1, "$C_i$" is the capacity of the gate insulating layer in the corresponding thin-film transistor, and is inversely proportional to the thickness of the gate insulating layer. In the above equation, since "$C_i$" is located in the denominator, the conclusion that the S-factor is increased when the gate insulating layer in the corresponding thin-film transistor is thick and is reduced when the gate insulating layer is thin is derived.

In the present disclosure, with reference to the above-described Equation 1 and the relationship of the S-factor with reference to FIGS. 4A and 4B, the driving thin-film transistor has a stack structure different from that of the other thin-film transistors. That is, as illustrated in FIG. 4B, the driving thin-film transistor has a large S-factor to realize sufficient gradation, and the other thin-film transistors, as illustrated in FIG. 4A, have a small S-factor to maintain the high response time thereof.

That is, in the backplane substrate and the organic light-emitting display device using the same according to the present disclosure, the driving thin-film transistor has a cross-sectional configuration different from that of the other thin-film transistors in a super-high-resolution structure. Thereby, the driving thin-film transistor may have a sufficient S-factor to realize gradation of 256 or more colors within an increased $\Delta V_{gs}$ range. In this way, a high gradation image resembling an actual image may be displayed. In addition, the switching thin-film transistor and/or the sensing thin-film transistor or the circuit thin-film transistor may maintain high mobility and high response time so as to secure the high-performance circuit operation of each sub-pixel.

*First Example*

Figure 5:
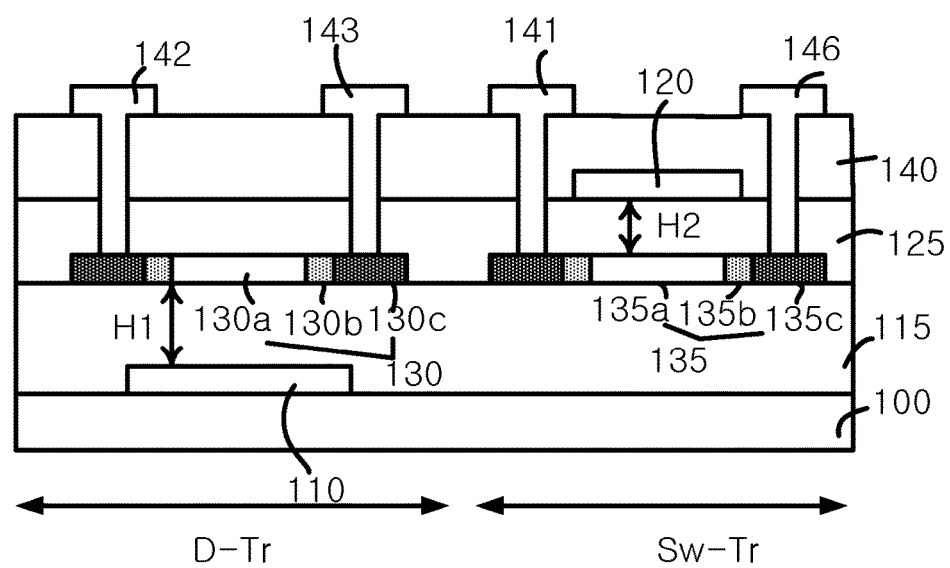
FIG. 5 is a schematic cross-sectional view illustrating a backplane substrate according to an aspect of the present disclosure.

FIG. 5 is a schematic cross-sectional view illustrating a backplane substrate of an organic light-emitting display device according to a first aspect of the present disclosure.

As illustrated in FIG. 5, the backplane substrate according to the first aspect of the present disclosure includes the substrate 100 having a plurality of sub-pixels, the driving thin-film transistor D-Tr, which is located in each sub-pixel and includes a first gate electrode 110, a first active layer 130 formed of polysilicon, a first source electrode 142 and a first drain electrode 143 connected to the opposite side of a first channel 130a of the first active layer 130, and a first gate insulating layer 115 between the first active layer 130 and the first gate electrode 110, and the switching thin-film transistor S-Tr, which is located in each sub-pixel and connected to the driving thin-film transistor D-Tr and includes a second gate electrode 120, a second active layer 135 formed of polysilicon, a second source electrode 141 and a second drain electrode 146 connected to opposite sides of a second channel 135a of the second active layer 135, and a second gate insulating layer 125 between the second active layer 135 and the second gate electrode 120. In some cases, a separate electrode may be formed on a back-channel portion of the driving thin-film transistor D-Tr using the process of forming the second gate electrode.

In addition, in the backplane substrate according to the first aspect of the present disclosure, the first active layer 130 and the second active layer 135 are located in the same layer, and a first distance H1 between the first gate electrode 110 and the first active layer 130 is longer than a second distance H2 between the second gate electrode 120 and the second active layer 135.

The first distance H1 corresponds to the thickness of the first gate insulating layer 115, and the second distance H2 corresponds to the thickness of the second gate insulating layer 125. Thus, the first gate insulating layer 115 is thicker than the second gate insulating layer 125. The first and second gate insulating layers 115 and 125 may be formed of inorganic materials such as, $SiO_x$, $SiN_x$, $SiO_xN_y$, and $HfO_2$. When the inorganic materials of the first and second gate insulating layers 115 and 125 have the same or similar dielectric constant, as described above, the first and second gate insulating layers 115 and 125 may have a difference in thickness. In some cases, when the materials of the first and second gate insulating layers 115 and 125 have different dielectric constants, in consideration of the capacity Ci that is determined by the dielectric constant and the thickness, the thicknesses of the first and second gate insulating layers 115 and 125 may be changed so that the first gate insulating layer 115 has a smaller capacity than the second gate insulating layer 125. Although the upper surfaces of the first and second gate insulating layers 115 and 125 are illustrated as being flat in the drawings, the disclosure is not limited thereto, and the upper surfaces may be formed in consideration of the difference in distance between the first gate electrode 110 and the first and second active layers 130 and 135 located thereunder.

Here, the first gate electrode 110 and the first gate insulating layer 115 are located below the first active layer 130 and the second active layer 135, which are located in the same layer, and the second gate electrode 120 and the second gate insulating layer 125 are located above the first active layer 130 and the second active layer 135.

In the backplane substrate according to the first aspect of the present disclosure, the driving thin-film transistor, which is directly connected to the organic light-emitting diode so as to control current, has a stack structure in which the first thickness of the first gate insulating layer 115 (the distance H1 between the first gate electrode and the first active layer) is large to achieve an S-factor of 0.2 V/dec or more. Thereby, the $\Delta V_{gs}$ exceeds at least 1V, and preferably, becomes 1.5V or more, which enables the realization of sufficient gradation within a wide $\Delta V_{gs}$ range. In this case, in the switching thin-film transistor and any additional thin-film transistor, unlike the driving thin-film transistor, the second gate electrode 120 is located above the second active layer 135, and thus the second gate insulating layer 125 between the second active layer 135 and the second gate electrode 120 is in a different location, whereby the stack structure of the driving thin-film transistor is differentiated from the stack structure of the other thin-film transistors. At this time, the S-factor of the switching thin-film transistor is below 0.2 V/dec, and the $\Delta V_{gs}$ is below 1V. A lower $\Delta V_{gs}$ is advantageous for high-speed driving.

Accordingly, in the backplane substrate according to the first aspect of the present disclosure, with respect to the switching thin-film transistor and other thin-film transistors, the required thickness of the second gate insulating layer 125 can be reduced so as to attain a lower S-factor than that in the driving thin-film transistor and to maintain the high mobility and high response time thereof.

In particular, the present disclosure addresses the issue whereby gradation is limited in a structure having a high resolution of 1500 ppi when all thin-film transistors provided in a reduced area of the sub-pixel have the same stack structure and thus exhibit a small S-factor together, as illustrated in FIG. 4A. To solve this problem, as illustrated in FIG. 4B, the vertical structure of the driving thin-film transistor, which has a direct effect on gradation, is selectively changed so that the S-factor and the $\Delta V_{gs}$ thereof are increased to enable high gradation. In addition, as one example of changing the vertical structure, in the backplane substrate of the present disclosure, the driving thin-film transistor has a bottom-gate-electrode structure, whereas the switching thin-film transistor and other thin-film transistors have a top-gate-electrode structure. In the backplane substrate of the present disclosure, the switching thin-film transistor and other thin-film transistors have a small S-factor and a small $\Delta V_{gs}$ in order to maintain the high response time thereof, as illustrated in FIG. 4A.

The thin-film transistors formed in the backplane substrate of the present disclosure include the first and second active layers 130 and 135 located in the same layer, which are formed when amorphous silicon is deposited and crystallized to polysilicon, and advantageously have higher mobility than amorphous silicon.

Meanwhile, in a cooling process after crystallization using a laser, in order to prevent short-circuiting of the first active layer 130 caused by mass-flow or condensation of a crystalline substance in the first active layer 130 above the first gate electrode 110, the first gate electrode 110 is deposited to a sufficiently smaller thickness within a range from 500 Å to 2000 Å than that of the second gate electrode 120. That is, when the first gate electrode 110 is sufficiently thin and the first gate insulation layer 115 is thick, short-circuiting of the first active layer 130 at the edges of the first gate electrode 110 may be prevented. In order to more effectively prevent short-circuiting of the first active layer 130, opposite edges of the first gate electrode 110 may have a gentle slope of 45 degrees or less, which may minimize the difference in distance depending on the presence or absence of a gate electrode component near the region at which the first active layer overlaps opposite edges of the first gate electrode.

The first active layer 130 includes the first channel 130a corresponding to the top of the first gate electrode 110, LDD areas 130b at opposite sides of the first channel 130a, and high-density dopant areas 130c outwardly in contact with the respective LDD areas 130b. In addition, the high-density dopant areas 130c located at opposite sides of the first channel 130a are connected to the first source electrode 142 and the first drain electrode 143.

Similar to the first active layer 130, the second active layer 135 includes the second channel 135a corresponding to the bottom of the second gate electrode 120, LDD areas 135b at opposite sides of the second channel 130a, and high-density dopant areas 135c outwardly in contact with the respective LDD areas 135b. In addition, the high-density dopant areas 135c located at opposite sides of the first channel 135a are connected to the second source electrode 141 and the second drain electrode 146.

Although FIG. 5 illustrates the first and second source electrodes 142 and 141 and the first and second drain electrodes 143 and 146 as being located in the same layer, the disclosure is not limited thereto, and the source and drain electrodes may be located in different layers for the driving thin-film transistor D-Tr, the switching thin-film transistor, or any other thin-film transistor.

Meanwhile, in FIG. 5, reference numeral 140 denotes a first interlayer insulating layer. This layer is located between the second gate electrode 120 and the first and second source electrodes 142 and 141 and the first and second drain electrodes 143 and 146, and serves to prevent metal-to-metal short-circuiting at the intersections of metals of the respective layers. The interlayer insulating layer may include a silicon nitride $SiN_x$ and may be used as a hydrogen supply source during laser crystallization.

In the backplane substrate according to the first aspect of the present disclosure, only the first gate insulating layer 115 in the driving thin-film transistor D-Tr is thick to achieve a large S-factor, and the other thin-film transistors excluding the driving thin-film transistor D-Tr have the same stack structure so that the second gate insulating layer 125 thereof is thin.

Meanwhile, the first and second gate electrodes 110 and 120, the first and second source electrodes 142 and 141, and the first and second drain electrodes 143 and 146 may be formed in a single layer or multiple layers using molybdenum, copper, tungsten, aluminum, or an alloy thereof.

Figure 6:
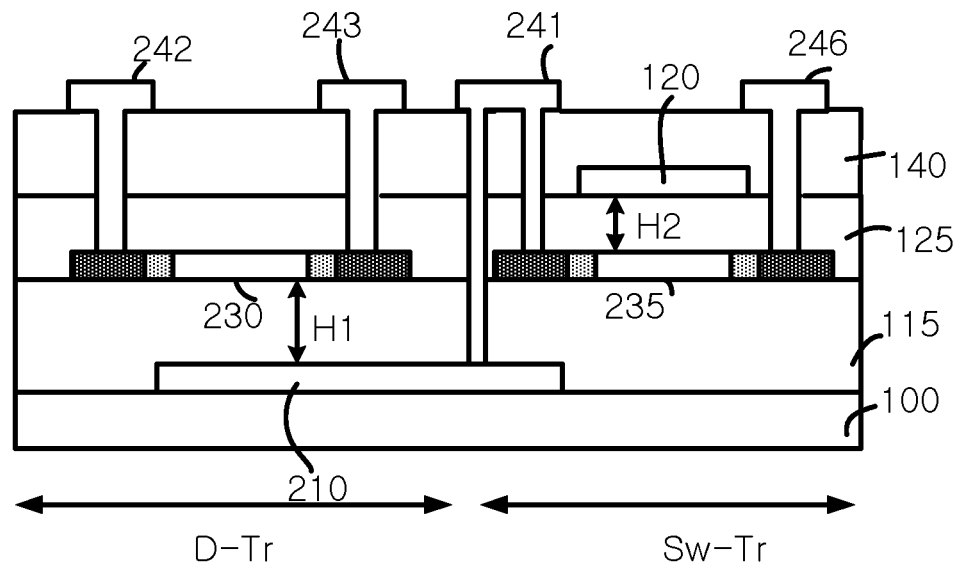
FIG. 6 is a cross-sectional view illustrating a modification of the aspect of the present disclosure.

FIG. 6 is a cross-sectional view illustrating a modification of the first aspect of the present disclosure.

As illustrated in FIGS. 6 and 2, a first gate electrode 210 of the driving thin-film transistor may extend to one side so as to be connected to an extension of a second source electrode 241 of the switching thin-film transistor. In this case, the extension of the second source electrode 241 penetrates the first interlayer insulating layer 140, the second gate insulating layer 125 and the first gate insulating layer 115 and is connected to the first gate electrode 210 located thereunder.

Here, the second source electrode 241 may take the form of a single vertical portion, which is formed so as to penetrate a second active layer 235 and extend to the top of the first gate electrode 210, using a mask that is different from that for a first source electrode 242 and first and second drain electrodes 243 and 246. In this case, the vertical portion forming the second source electrode penetrates the second active layer 135 and is connected at the side surface thereof to the second active layer 135.

Figure 7:
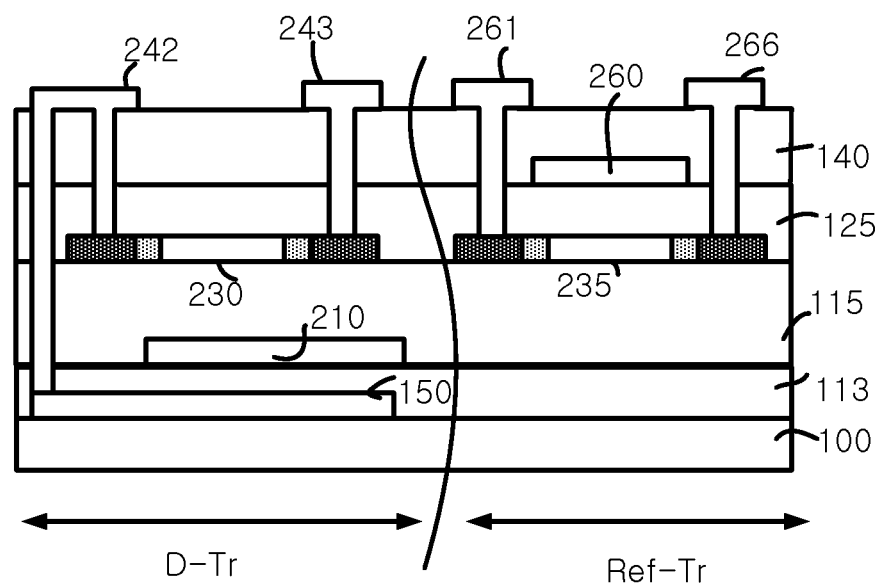
FIG. 7 is a cross-sectional view illustrating an expanded example of the aspect of the present disclosure.

FIG. 7 is a cross-sectional view illustrating an expanded example of the first aspect of the present disclosure.

As illustrated in FIGS. 2 and 7, when the sensing thin-film transistor Ref-Tr is further provided in addition to the driving thin-film transistor D-Tr and the switching thin-film transistor SW-Tr, the sensing thin-film transistor Ref-Tr may have the same stack structure as the switching thin-film transistor Sw-Tr, and may include a third gate electrode 260, a third source electrode 261, and a third drain electrode 266, which are located respectively in the same layer as the second gate electrode 120 or 220 and the same layer as the second source electrode 141 or 241 and the second drain electrode 146 or 246 of FIG. 5 or FIG. 6.

In addition, when the sensing thin-film transistor Ref-Tr is provided along with the driving thin-film transistor D-Tr and the switching thin-film transistor SW-Tr in the sub-pixel, the sensing thin-film transistor Ref-Tr may share the second active layer 235 of the switching thin-film transistor Sw-Tr or the first active layer 230 of the driving thin-film transistor D-Tr.

In some cases, the circuit thin-film transistor of a circuit portion, which is located in the peripheral region of FIG. 1, may have the same structure as the switching thin-film transistor SW-Tr and/or the sensing thin-film transistor Ref-Tr. In this case, the reason why the circuit thin-film transistor of the circuit portion has the same structure as the switching thin-film transistor is to attain a high response time based on the rapid turn-on of the switching thin-film transistor, as illustrated in FIG. 4A.

The first source electrode 242 of the driving thin-film transistor D-Tr of FIG. 7 may be integrally formed with the third source electrode 261 of the sensing thin-film transistor Ref-Tr so as to be connected thereto (see the second node B of FIG. 2). In this case, the two thin-film transistors in the sub-pixel share the source electrodes 242 and 261, which may reduce the area occupied by elements in the sub-pixel.

In addition, the first source electrode 242 may extend to one side so as to be connected to the first active layer 230 and may further include a connection portion, which is vertically located to the underside of the first gate electrode 210 so as to be connected to a first storage electrode 150.

Meanwhile, reference numeral 113 denotes a second interlayer insulating layer, which is provided to electrically separate the first gate electrode 210 and the first storage electrode 150 from each other.

Referring to FIGS. 2 and 7, in order to increase the area of the storage capacitor $C_{st}$, the first storage electrode 150 may be connected to the same node (see the second node B of FIG. 2) as the first source electrode 242 and may be located below the first gate electrode 210 so as to overlap the first gate electrode 210. In this case, the first gate electrode 210 functions as a second storage electrode (see the second node B of FIG. 2), and the storage capacitor is defined in the region in which the first storage electrode 150 and the first gate electrode 210 overlap each other.

Although FIG. 7 illustrates an example in which the first storage electrode 150 is provided below the first gate electrode 210, the disclosure is not limited thereto, and the first storage electrode 150 may be provided in a different layer location so as to be connected to the first source electrode 242.

Although the above-described first aspect of the present disclosure describes an example in which two transistors or three transistors are provided in the sub-pixel, the disclosure is not limited thereto, and four or more transistors may be provided. That is, in the backplane substrate and the organic light-emitting display device of the present disclosure, among the thin-film transistors provided in the sub-pixel, the driving thin-film transistor, which is directly connected to the organic light-emitting diode, may include a thick gate insulating layer to attain a large S-factor for realizing sufficient gradation, and the other thin-film transistors (the switching thin-film transistor, the sensing thin-film transistor, and the circuit thin-film transistor) may have a thin gate insulating layer to maintain the high response time thereof.

Meanwhile, a method of manufacturing the backplane substrate according to the first aspect of the present disclosure will be described below with reference to FIGS. 1 and 2 and FIGS. 5 to 7.

First, the substrate 100 in which a plurality of sub-pixels SP is provided and each sub-pixel SP includes a first area (D-Tr area) and a second area (Sw-Tr area, which are partitions from each other, is prepared.

Subsequently, the first gate electrode 110 or 210 is provided by selectively removing a material, which is formed in a single layer or multiple layers using molybdenum, copper, tungsten, aluminum, or an alloy thereof, from the first area (D-Tr area) of each sub-pixel SP.

Subsequently, the first gate insulating layer 115 is provided by depositing an inorganic material such as $SiO_x$, $SiN_x$, $SiO_xN_y$, and $HfO_2$, to the first thickness H1 so as to cover the first gate electrode 110 or 210.

Subsequently, the first active layer 130 and the second active layer 135, which are formed of polysilicon, are provided on the first gate insulating layer 115 in the first area (D-Tr area) and the second area (Sw-Tr area), respectively.

Specifically, the first and second active layers 130 and 135 are provided by depositing an amorphous silicon layer on the entire surface of the first gate insulating layer 115, crystallizing the amorphous silicon layer to a polysilicon layer, and selectively removing the polysilicon layer so as to leave the first active layer and the second active layer in the first area and the second area.

Then, the LDD areas 130b and 135b and the high-density dopant areas 130c and 135c may be defined by selectively doping the first and second active layers 130 and 135 with a dopant using a mask. In this process, the intrinsic areas between the LDD areas 130b and between the LDD areas 135b are respectively defined as the first channel 130a and the second channel 135a.

Subsequently, the second gate insulating layer 125 is formed using an inorganic material such as $SiO_x$, $SiN_x$, $SiO_xN_y$, and $HfO_2$, to the second thickness H2, which is smaller than the first thickness H1, so as to cover the first and second active layers 130 and 135. In some cases, the dopant areas 130b, 130c, 135b and 135c of the first and second active layers 130 and 135 may be defined after the second gate insulating layer 125 is formed.

Subsequently, the second gate electrode 120 is provided on the second gate insulating layer 125 so as to correspond to the top of the second active layer 135 by selectively removing a material, which is formed in a single layer or multiple layers using molybdenum, copper, tungsten, aluminum, or an alloy thereof. The second gate electrode 120 may be integrated with the scan line SL.

Subsequently, the first interlayer insulating layer 140 is provided to cover the scan line SL and the second gate electrode 120. Then, the first interlayer insulating layer 140 and the second gate insulating layer 125 are selectively removed so as to expose a portion of the high-density dopant areas 130c and 135c of the first and second active layers 130 and 135.

Subsequently, the first source electrode 142 or 242 and the first drain electrode 143 or 243, which are connected to the high-density dopant areas 130c at opposite sides of the first channel 130a of the first active layer 130, and the second source electrode 141 or 241 and the second drain electrode 146 or 246, which are connected to opposite sides of the second active layer 135, are provided by depositing a material, which is formed in a single layer or multiple layers using molybdenum, copper, tungsten, aluminum, or an alloy thereof and selectively removing the deposited material.

*Second Example*

Hereinafter, a backplane substrate according to a second aspect of the present disclosure will be described.

Figure 8:
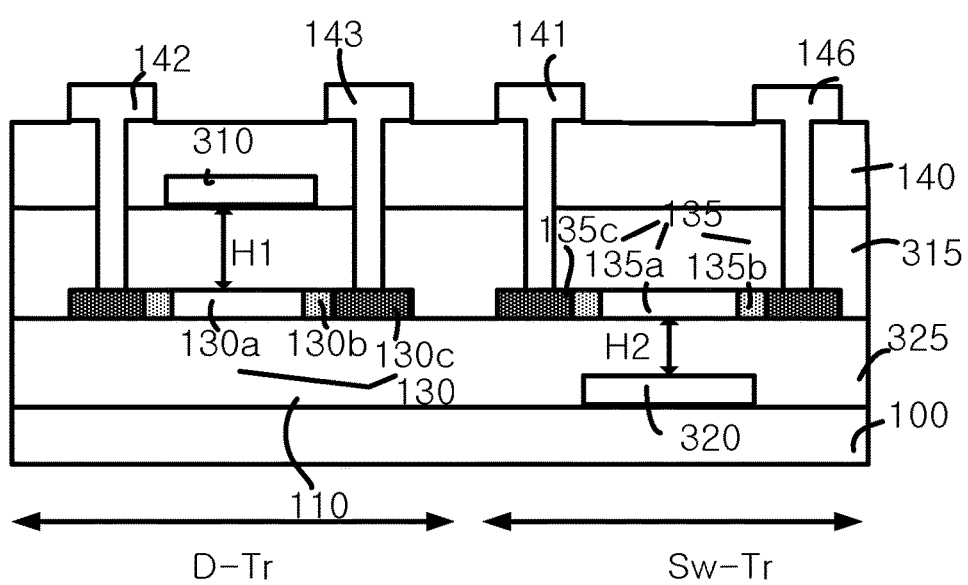
FIG. 8 is a schematic cross-sectional view illustrating a backplane substrate according to another aspect of the present disclosure.

FIG. 8 is a schematic cross-sectional view illustrating a backplane substrate according to a second aspect of the present disclosure.

As illustrated in FIG. 8, compared to the structure of the first aspect described above, the backplane substrate according to the second aspect of the present disclosure is distinguished in that a first gate electrode 310 and a first gate insulating layer 315 of the driving thin-film transistor are located above the first and second active layers 130 and 135 and a second gate electrode 320 and a second gate insulating layer 325 of the switching thin-film transistor (and/or the sensing thin-film transistor) are located below the first and second active layers 130 and 135, and at this time, the first gate insulating layer 315 located above the first and second active layers 130 and 135 is thicker than the second gate insulating layer 325 located below the first and second active layers 130 and 135, and the other configurations can be the same as the features shown in FIG. 5 as described above.

Even in this configuration, for the same purpose as in the above-described first aspect, only the driving thin-film transistor D-Tr includes a thick gate insulating layer to attain a large S-factor for realizing sufficient gradation and the other thin-film transistors excluding the driving thin-film transistor have the same configuration and include a thin gate insulating layer to maintain a predetermined response speed required for circuit operation in the sub-pixel.

Meanwhile, even in the backplane substrate according to the second aspect of the present disclosure, in a cooling process after crystallization using a laser, in order to prevent short-circuit in the second active layer 135 caused by mass-flow or condensation of a crystalline substance in the second active layer 135 above the second gate electrode 320, the second gate electrode 320 is deposited to a sufficiently smaller thickness within a range from 500 Å to 2000 Å than that of the first gate electrode 310. In this case, since the second gate electrode 320 located below the second active layer 135 is thin enough, the effect of the difference in distance between the second active layer 135 and an electrode material thereunder is less, even if the second gate insulating layer 325 is thinner than a certain level, which may prevent short-circuit at the edges of the second gate electrode 320. In order to more effectively prevent short-circuit in the second active layer 135, the opposite edges of the second gate electrode may have a gentle slope of 45 degrees or less, which may minimize the difference in distance depending on the presence or absence of a gate electrode component near the region at which the second active layer overlaps opposite edges of the second gate electrode.

Hereinafter, an organic light-emitting display device using the above-described backplane substrate will be described.

Figure 9:
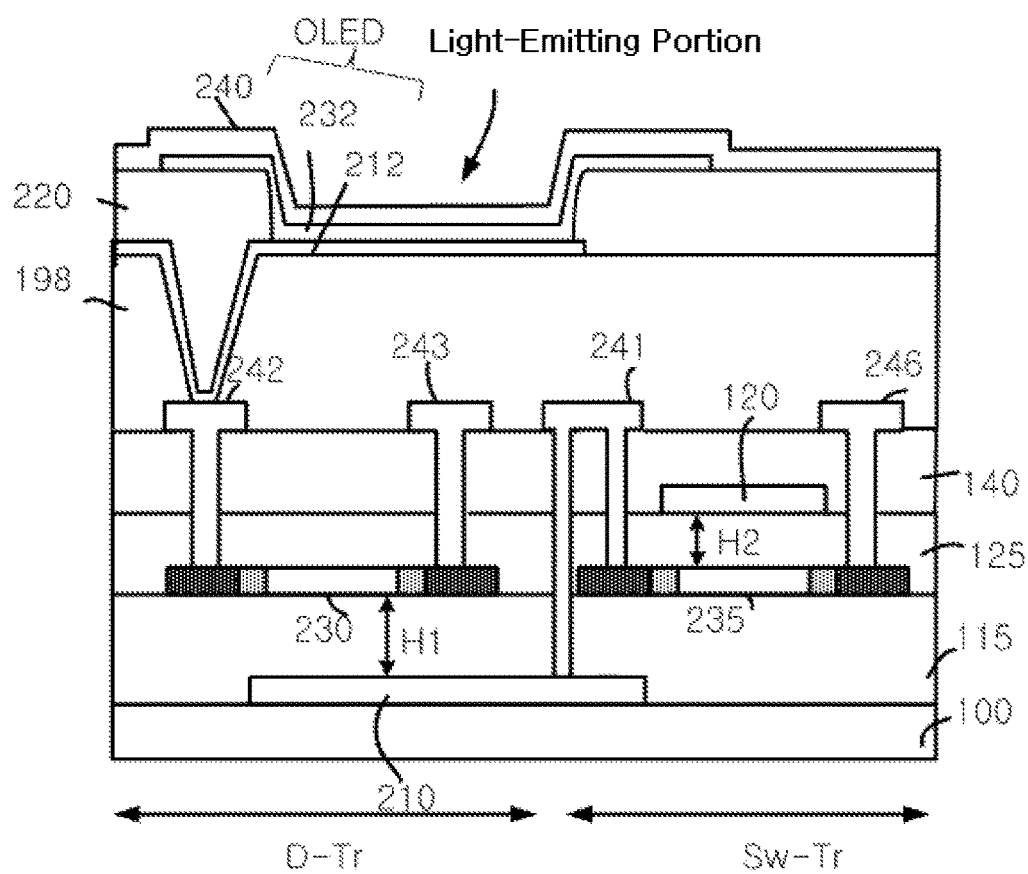
FIG. 9 is a cross-sectional view illustrating one form of an organic light-emitting display device using the backplane substrate according to the aspect of the present disclosure.

FIG. 9 is a cross-sectional view illustrating one form of an organic light-emitting display device using the backplane substrate according to the first aspect of the present disclosure.

As illustrated in FIG. 9, in addition to the above-described backplane substrate, the organic light-emitting display device using the backplane substrate according to the first aspect of the present disclosure further includes a storage capacitor $C_{st}$ between the first gate electrode 110 and the first source electrode 242, and an organic light-emitting diode (OLED), which includes an anode electrode 212 connected to the first source electrode 242, a cathode electrode 240 opposite the anode electrode 212, and an organic layer 232 including an organic light-emitting layer located between the anode electrode and the cathode electrode.

Although not illustrated, referring to FIG. 7, in order to increase the area of the storage capacitor $C_{st}$, the organic light-emitting display device may further include the first storage electrode 150, which is connected to the same node as the first source electrode 242 and is located below the first gate electrode 210 so as to overlap the first gate electrode 110. In this case, the first gate electrode 110 may function as a second storage electrode and may form a storage capacitor at the region in which it overlaps the first storage electrode 150.

In addition, a bank 220 may be selectively provided on the anode electrode 212 to define a light-emitting portion.

Here, a reference numeral 198 denotes a protective layer, which functions as protecting TFTs of the backplane substrate thereunder.

In addition, the organic light-emitting display device may further include a barrier layer or a barrier stack (not illustrated), which covers the top of the organic light-emitting diode (OLED) in order to prevent introduction of outside moisture or outside air. The barrier stack may be a stack of an organic layer and an inorganic layer.

Meanwhile, the configuration of the backplane substrate may be replaced with that of the second aspect, and the organic light-emitting display device having the above-described configuration is configured such that, among all thin-film transistors provided in each sub-pixel, only the driving thin-film transistor D-Tr includes a thick gate insulating layer to attain a large S-factor for realizing sufficient gradation and the other thin-film transistors excluding the driving thin-film transistor have the same configuration and include a thin gate insulating layer to maintain a predetermined response speed required for circuit operation in the sub-pixel.

In addition, in the backplane substrate and the organic light-emitting display device of the present disclosure, since the driving thin-film transistor has a bottom-gate-electrode structure and the other thin-film transistors have a top-gate-electrode structure on the basis of the active layer so that the gate electrodes thereof are located in different layers, the distance between the two gate electrodes in a plane may be reduced, or the two gate electrodes may overlap each other without requiring consideration of a process margin, which enables a reduction in the size of pixels and is advantageous from the aspect of decreasing the size of a display device.

The backplane substrate and the organic light-emitting display device using the same of the present disclosure are implemented in consideration of the following description.

That is, considering the planar structure of a small display device, the higher the resolution thereof, the size of respective sub-pixels thereof as well as the light-emitting area thereof are reduced, and thus a required drain current range is reduced and a time taken to saturate the current is reduced. As such, although the response time of each element is increased, the S-factor of the element is reduced, which results in a limitation on gradation. Therefore, it is proposed to change the vertical cross-sectional structure of the element. However, although it is necessary to increase the S-factor of the driving thin-film transistor in the sub-pixel, which has a direct effect on gradation, changing all elements (thin-film transistors) provided in the sub-pixel are changed to have the same shape may cause deterioration in the characteristics of the entire sub-pixel and may be very disadvantageous in terms of securing, for example, the characteristics of a switching thin-film transistor. Therefore, in order to increase the S-factor of the driving thin-film transistor, which may have a direct effect on the current value, so that the $\Delta V_{gs}$ becomes 1 V or more, only the driving thin-film transistor D-Tr includes a thick first gate insulating layer and the other thin-film transistors include a thin second gate insulating layer to maintain a predetermined response speed thereof for high resolution.

In addition, in the present disclosure, the driving thin-film transistor has a different gate electrode position and a different gate insulating layer thickness from those of the other thin-film transistors so as to exhibit characteristics different from those of the other thin-film transistors. Thereby, even in a super-high-resolution structure, by adjusting the S-factor of only the driving thin-film transistor, it is possible to realize sufficient gradation while maintaining sufficient circuit characteristics in required regions. In this way, it is possible to realize a super-high-resolution organic light-emitting display device having excellent circuit characteristics and sufficient gradation.

Although most of the current polysilicon-type thin-film transistors are manufactured in a top-gate-electrode structure, a degree of freedom in designing a backplane substrate for a mobile display may be increased via the development of various polysilicon-type thin-film transistors having a bottom-gate-electrode structure.

In addition, the above-described backplane substrate may also be applied to the development of other displays that require various gradations.

As is apparent from the above description, a backplane substrate and an organic light-emitting display device using the same have the following effects.

In the backplane substrate and the organic light-emitting display device of the present disclosure, sufficient gradation may be realized by increasing the S-factor of a driving thin-film transistor that has a direct effect on gradation.

In addition, other thin-film transistors such as, for example, a switching thin-film transistor, may have a different stack structure from the driving thin-film transistor so as to exhibit the sufficient mobility and high response time thereof. Thereby, in a high-resolution or super-high-resolution structure, both sufficient gradation and high-performance circuit operations may be achieved.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Accordingly, various aspects disclosed in the present disclosure are not intended to limit the technical sprit of the present disclosure, and the scope of the technical sprit of the present disclosure should be interpreted based on the following claims, and all technical ideas that fall within the range equivalent to the claims should be understood as belonging to the scope of the present disclosure.

What is claimed is:

1. A backplane substrate of a display device, comprising:
   a substrate having an active area and a peripheral area where the active area has a plurality of sub-pixels;
   a driving thin-film transistor located in each sub-pixel and including a first gate electrode, a first active layer, a first source electrode and a first drain electrode connected to opposite sides of a first channel of the first active layer, and a first gate insulating layer between the first active layer and the first gate electrode; and a switching thin-film transistor located at each sub-pixel, connected to the driving thin-film transistor, and including a second gate electrode, a second active layer, a second source electrode and a second drain electrode connected to opposite sides of a second channel of the second active layer, and a second gate insulating layer between the second active layer and the second gate electrode, wherein the first active layer and the second active layer are located in the same layer and directly in contact with the first gate insulating layer and the second gate insulating layer, respectively, wherein the first gate electrode of the driving thin-film transistor and the second gate electrode of the switching thin-film transistor are located in different layers with respect to the first and second active layers in the same layer at each sub-pixel, wherein a first distance between the first gate electrode and the first active layer is greater than a second distance between the second gate electrode and the second active layer, and wherein the first gate electrode is thinner than the second gate electrode.

2. The backplane substrate according to claim 1, wherein the first gate insulating layer is thicker than the second gate insulating layer.

3. The backplane substrate according to claim 1, wherein the first gate electrode and the first gate insulating layer are located below the first active layer and the second active layer, and wherein the second gate electrode and the second gate insulating layer are located above the first active layer and the second active layer.

4. The backplane substrate according to claim 1, wherein the first gate electrode has a thickness in a range of 500 Å to 2000 Å.

5. The backplane substrate according to claim 1, further comprising a buffer thin-film transistor including a third gate electrode, a third source electrode and a third drain electrode, which are located respectively in the same layers as the second gate electrode, the second source electrode and the second drain electrode.

6. The backplane substrate according to claim 1, further comprising a first extension and a second extension protruded from the second source electrode, wherein the first extension connects the second source electrode to one side of the second channel of the second active layer and the second extension connects the second source electrode to the first gate electrode.

7. The backplane substrate according to claim 5, wherein the first source electrode is connected to the third source electrode.

8. The backplane substrate according to claim 1, wherein the second gate electrode and the second gate insulating layer are located below the first active layer and the second active layer, and wherein the first gate electrode and the first gate insulating layer are located above the first active layer and the second active layer.

9. The backplane substrate according to claim 1, further comprising a circuit thin-film transistor in the peripheral area having the same structure as the switching thin-film transistor.

10. The backplane substrate according to claim 1, wherein the driving thin-film transistor has an S-factor of 0.2 V/dec or more, and the switching thin-film transistor has an S-factor less than 0.2 V/dec, wherein the S-factor (S) is defined by:

$$S = 2.3 \frac{kT}{q} \left[ 1 + \frac{(C_d + Cit)}{C_i} \right]$$

where $C_i$ is a capacity of a gate insulating layer of each transistor, $C_d$ is a capacity of a depletion area of each transistor, Cit is a captured density of a gap in the gate insulating layer of each transistor and kT/q is a thermal voltage of the display device.

11. A backplane substrate of a display device, comprising:
a substrate having an active area and a peripheral area where the active area has a plurality of sub-pixels;
a driving thin-film transistor located in each sub-pixel and including a first gate electrode, a first active layer located above the first gate electrode, a first source electrode and a first drain electrode connected to opposite sides of a first channel of the first active layer, and a first gate insulating layer between the first active layer and the first gate electrode; and
a switching thin-film transistor located at each sub-pixel, connected to the driving thin-film transistor and including a second gate electrode, a second active layer located below the second gate electrode, a second source electrode and a second drain electrode connected to opposite sides of a second channel of the second active layer, and a second gate insulating layer between the second active layer and the second gate electrode, wherein the first active layer and the second active layer are located at the same layer and directly in contact with the first gate insulating layer and the second gate insulating layer, respectively, wherein the first gate electrode of the driving thin-film transistor and the second gate electrode of the switching thin-film transistor are located in different layers with respect to the first and second active layers in the same layer at each sub-pixel, wherein a first distance between the first gate electrode and the first active layer is greater than a second distance between the second gate electrode and the second active layer, and wherein the first gate electrode is thinner than the second gate electrode.

12. An organic light-emitting display device comprising:
a substrate having a plurality of sub-pixels;
a driving thin-film transistor located in each sub-pixel and including a first gate electrode, a first active layer located above the first gate electrode, a first source electrode and a first drain electrode connected to opposite sides of a first channel of the first active layer, and a first gate insulating layer between the first active layer and the first gate electrode; and
a switching thin-film transistor located in each sub-pixel connected to the driving thin-film transistor and including a second gate electrode, a second active layer located below the second gate electrode, a second source electrode and a second drain electrode connected to opposite sides of a second channel of the second active layer, and a second gate insulating layer between the second active layer and the second gate electrode;
a storage capacitor between the first gate electrode and the first source electrode; and
an organic light-emitting diode including an anode connected to the first source electrode, a cathode opposite the anode, and an organic layer including an organic light-emitting layer located between the anode and the cathode,
wherein the first active layer and the second active layer are located at the same layer and directly in contact with the first gate insulating layer and the second gate insulating layer, respectively,
wherein the first gate electrode of the driving thin-film transistor and the second gate electrode of the switching thin-film transistor are located in different layers with respect to the first and second active layers in the same layer at each sub-pixel, and
wherein a first distance between the first gate electrode and the first active layer is greater than a second distance between the second gate electrode and the second active layer.

13. A backplane substrate of a display, comprising:
a plurality of sub-pixels at a substrate;
a driving thin-film transistor at each sub-pixel and including a first gate insulating layer, a first gate electrode, a first active layer, wherein the first gate insulating layer has a first distance between the first gate electrode and the first active layer; and
a switching thin-film transistor at each sub-pixel and electrically connected to the driving thin-film transistor and including a second gate insulating layer, a second gate electrode in a different layer from the first gate electrode, a second active layer, wherein the second gate insulating layer has a second distance between the second gate electrode and the second active layer,
wherein the first active layer and the second active layer are located at the same layer and directly in contact with the first gate insulating layer and the second gate insulating layer, respectively,
wherein the first gate electrode of the driving thin-film transistor and the second gate electrode of the switching thin-film transistor are located in different layers with respect to the first and second active layers in the same layer at each sub-pixel,
wherein the first gate insulating layer has a thickness great enough, so that the driving thin-film transistor has an S-factor of at least 0.2 V/dec and a gate-to-source voltage differential of at least 1.0 V, and the second gate insulating layer has a thickness smaller than that of the first gate insulating layer,
wherein the S-factor (S) is defined by:

$$S = 2.3 \frac{kT}{q} \left[ 1 + \frac{(C_d + Cit)}{C_i} \right]$$

where $C_i$ is a capacity of a gate insulating layer of each transistor, $C_d$ is a capacity of a depletion area in an active layer of each transistor, Cit is a captured density of a gap in the gate insulating layer of each transistor and kT/q is a thermal voltage of the display device.

14. The backplane substrate according to claim 13, wherein the switching thin-film transistor has an S-factor less than 0.2 V/dec.

15. The backplane substrate according to claim 13, wherein a first distance between the first gate electrode and the first active layer is greater than the second distance between the second gate electrode and the second active layer.

* * * * *